United States Patent
Anand et al.

(10) Patent No.: US 7,512,915 B2
(45) Date of Patent: Mar. 31, 2009

(54) EMBEDDED TEST CIRCUIT FOR TESTING INTEGRATED CIRCUITS AT THE DIE LEVEL

(75) Inventors: Darren Anand, Essex Junction, VT (US); Nazmul Habib, South Burlington, VT (US); Robert McMahon, Essex Junction, VT (US); Troy Perry, Georgia, VT (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 11/739,819

(22) Filed: Apr. 25, 2007

(65) Prior Publication Data

US 2008/0270951 A1    Oct. 30, 2008

(51) Int. Cl.
*G06F 17/50* (2006.01)
(52) U.S. Cl. .................... 716/4; 716/1; 716/5; 324/769
(58) Field of Classification Search ............... 716/1, 716/4, 5; 324/769
See application file for complete search history.

(56) References Cited

U.S. PATENT DOCUMENTS

| | | | |
|---|---|---|---|
| 6,294,921 B1 * | 9/2001 | Bonaccio et al. ............ 324/756 |
| 6,560,756 B1 * | 5/2003 | Necoechea et al. ............ 716/4 |
| 6,671,844 B1 * | 12/2003 | Krech et al. ................. 714/736 |
| 7,382,149 B2 * | 6/2008 | Anand et al. ................. 324/769 |
| 2005/0045952 A1 * | 3/2005 | Chatty et al. ................. 257/355 |
| 2005/0093560 A1 * | 5/2005 | Duan et al. ................. 324/763 |
| 2007/0075718 A1 * | 4/2007 | Hess et al. ................. 324/765 |
| 2008/0018356 A1 * | 1/2008 | Anand et al. ................. 324/769 |
| 2008/0222584 A1 * | 9/2008 | Habib et al. ................. 716/5 |

* cited by examiner

*Primary Examiner*—Jack Chiang
*Assistant Examiner*—Suchin Parihar
(74) *Attorney, Agent, or Firm*—W. Riyon Harding

(57) ABSTRACT

A design structure instantiated in a machine readable medium; the design structure includes all of the necessary information for designing a test circuit. The test circuit is used for performing device-specific testing and acquiring parametric data on integrated circuits, for example ASICs, such that each chip is tested individually without excessive test time requirements, additional silicon, or special test equipment. The design structure includes at least one test circuit and may be integrated into an IC design, along with all of the required manufacturing data for producing a final design structure. The final design structure may be in the form of a GDS storage medium or another form of medium suitable for sending the final data structure to, for example, a manufacturer, foundry, customer, or other design house.

19 Claims, 11 Drawing Sheets

EMBEDDED TEST CIRCUIT FOR TESTING INTEGRATED CIRCUITS AT THE DIE LEVEL

CROSS REFERENCES RELATED TO THE APPLICATION

This application for patent is related to U.S. application Ser. No. 11/459,367 filed Jul. 24, 2006, assigned to the present assignee.

BACKGROUND OF THE INVENTION

1. Field of the Invention

The invention relates to the field of acquiring manufacturing process data on a part-by-part basis (e.g. each die on a wafer) using an embedded test structure, and more specifically, to providing a means to acquire part-specific data to perform a detailed analysis of semiconductor products so that the analysis can be used to tune the manufacturing processes.

2. Background of the Invention

Due to the complex and precise nature of semiconductor manufacturing, it is critical to ensure that all processes within the manufacturing line are within required specifications in order to have the highest product yield. Monitoring the manufacturing process and correcting for deficiencies is critical for maintaining the health of the line (HOL).

Some testing is done in-line during manufacturing to tune the process real-time, and other tests are performed after manufacturing. Kerf testing is a common type of testing and provides information for a group of die on a wafer relating to process, voltage, and temperature (PVT). Other tests include: I/O receiver/driver levels, performance screen ring oscillator (PSRO) testing, and MUX scan testing, also known as "at speed" testing.

One disadvantage of kerf testing is that it does not provide detailed information specific to each die on the wafer and further, cannot provide information about the electrical parameters of certain devices within each of the chips; especially custom designs which have smaller manufacturing lot sizes, varying device dimensions from standard devices, and other product-specific qualities.

Since in-line testing is time consuming and expensive, it is important to perform adequate testing within a minimal amount of time. Generally, testing is done by sampling a set of kerfs to obtain an overall HOL measurement. For customized circuits, such as application specific integrated circuits (ASIC) testing by sampling does not provide an accurate assessment of device parameters within each die of the wafer, which is critical for improving yield and ensuring that customer requirements and delivery expectations are met.

BRIEF SUMMARY OF THE INVENTION

Based on the issues identified above, what is needed is a means for accurately testing customized circuitry so that adequate feedback can be relayed to the manufacturing line to ensure the highest possible yields. It is a further requirement that the testing means does not take an exceptional amount of time, nor take excessive silicon real estate and therefore, affect cost. The testing means must be adaptable to meet specific testing requirements without providing unnecessary test structure overhead.

The present invention is a test circuit, which resides on a computer readable medium and/or an IC. One or more of the test circuits are embedded into a physical IC design (typically in the backfill but can be instantiated anywhere in the design where manufacturing requirements and design specification requirements are met), and are adapted to provide accurate electrical and physical measurements of the circuit on that particular die. The test circuit is referred to throughout the specification as a test circuit 100 (shown in FIG. 1). Test circuit 100 includes a control block 190 having a logic controller 110 which activates one or more device under test (DUT) 170 and/or 180, a decode level translator 120 which provides a required logic level or required voltage to one or more DUTs 170 and/or 180, and a protection circuit which isolates the integrated circuit when the test circuit 100 is inactive.

The test circuit 100 may operate in either a single or dual supply mode. In the single supply mode, during wafer final test (WFT) and/or module final test (MFT), the current ($I_{on}$) measurement for each DUT is calculated and recorded. In dual supply mode, the circuit controls the voltage to a DUT 170 gate, for example, as well as provides power to DUT 170 source and/or drain. Measurements for threshold voltage ($V_t$), $I_{on}$, and effective current ($I_{eff}$) for each DUT 170 are then calculated and recorded.

Test circuit 100 is an embedded device performance monitor within integrated circuit chips. Test circuit 100 represents all device types and design points used on a chip. Test circuit 100 may be embedded in the existing electronic chip identification macro (ECID: used at IBM), which is guaranteed to be on every chip, or test circuit 100 may be placed as a stand-alone macro.

Test circuit 100 provides several unique, user-defined device tests. All tests include measuring and recording applicable parameters of on-chip devices such as average $I_{on}$, $V_t$, and $I_{eff}$ pertaining to an array of FETs. The tests account for spatial variations. DUTs 170 and/or 180 in this specification refers to but is not limited to nFET and pFET devices. DUTs 170 and/or 180 may also be wires, resistors, capacitors, inductors, and other circuit components. Additionally, across chip variation (ACV) data can be extracted and analyzed by placing multiple test structures 100 on a single chip.

All device types and design points on a particular chip are identified and matched with those present in test circuit 100 during release checking. If test circuit 100 contains device types that are not part of the chip design, then those types will be ignored during physical processing, meaning special masks will not be generated to support devices existing solely in test circuit 100. In this case, the unused devices will be processed with standard threshold devices on chip. Device information is relayed to the test engineers, and DUTs 170 and or 180, which are ignored during the processing step, will not be included at test.

The existing ECID macro contains a fatwire I/O with very low-resistance requirements (<10 Ohms guaranteed). This fatwire I/O is connected to a Precision Measurement Unit (PMU) which will be used for accurate voltage force, and current measure activity. Test circuit 100 may share this fatwire I/O with another test circuit 100.

Determination for minimum number of required test structures 100 per chip is applied during the chip design process. Metrics such as distance from the fatwire I/O, proximity to logic macros such as performance screen ring oscillator circuits (PSRO: used to guarantee product performance), and minimum distances between test structures 100 and other macros are provided in placement and design rule databases and files. One can appreciate that there are many specifications required to design an IC chip and the above list serves only as an example.

One having ordinary skill in the art can also appreciate the design flow process from concept to finished IC product. Many inputs including, for example: data, files, information, rules, patterns, specifications, and instructions are used in the design flow process. These inputs may be supplied by various vendors, foundries, manufacturers, customers, and design houses, to name a few. Test circuit 100 may therefore exist in many variations of electronic form, including machine readable medium, depending on where test circuit resides in the design flow at any given moment. Likewise, machine readable medium comprising test circuit 100 may be transferred to, for example, a customer, vendor, design house, etc. before ultimately entering the manufacturing stage (e.g. release to manufacturing, tape-out, etc.).

DETAILED DESCRIPTION OF THE INVENTION

Figure 1:
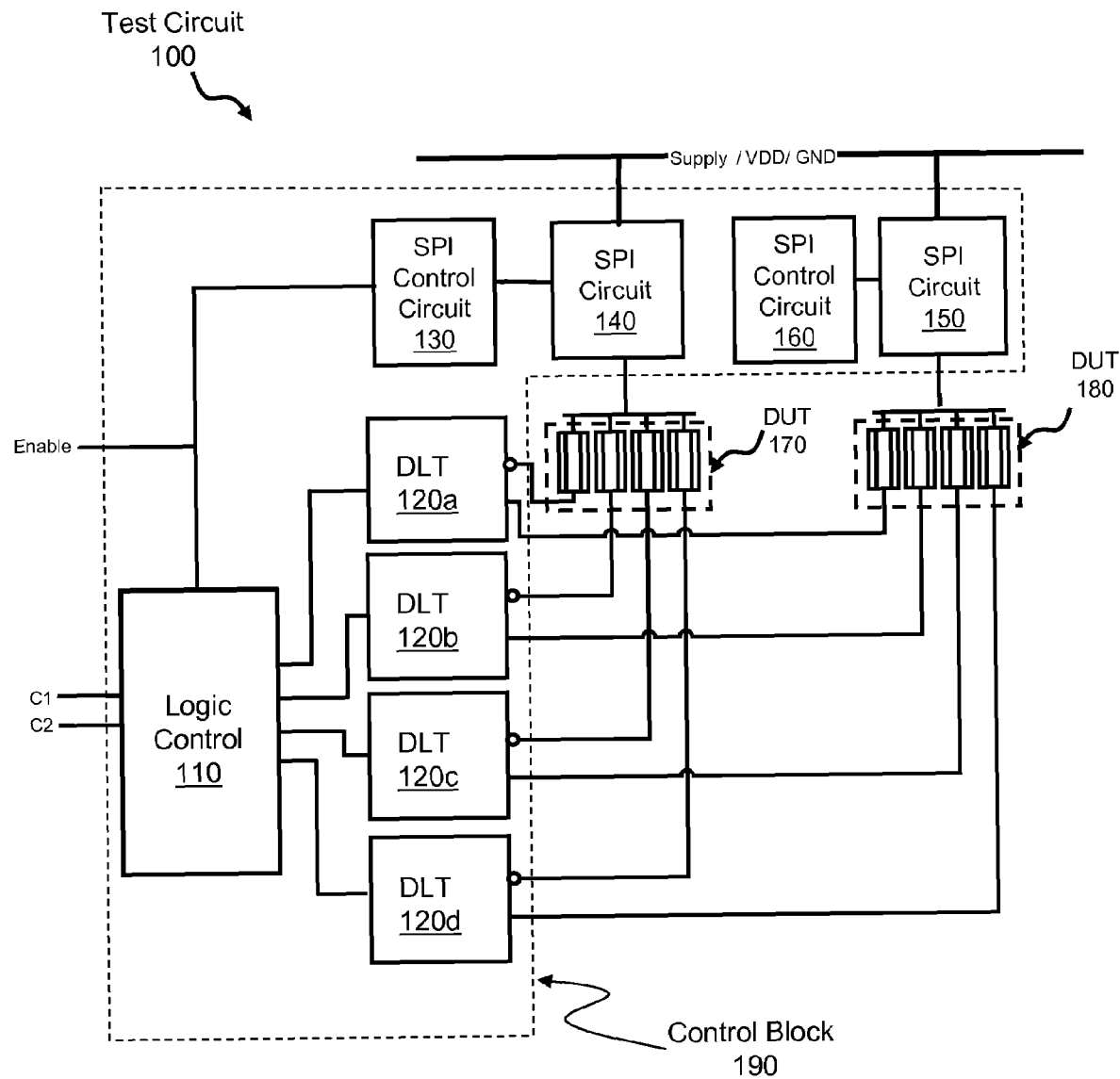
FIG. 1 is a system level block diagram of a test structure, which resides in a design structure on a computer readable medium.

FIG. 1 shows a test circuit 100 of the present invention, instantiated in a computer readable medium (not shown). Test circuit 100 includes a control block 190, which further includes logic control 110, a group of decode level translators (DLT) 120a-d (four DLTs are shown in this example), a pFET SPI circuit 140 coupled to an SPI control circuit 130, and an nFET SPI circuit 150 coupled to SPI control circuit 160. Test circuit 100 further includes a DUT 170, which represents one device type (in this example, an array of pFETs) and a DUT 180, which represents a second device type (in this example, an array of nFETs). Each of DUTs 170 and 180 are coupled to control block 190.

In operation, control block 190 exercises corresponding DUTs 170 and/or 180 and provides resulting test data to a test apparatus (not shown). Each element of test circuit 100 is further discussed in the following figures.

Figure 2:
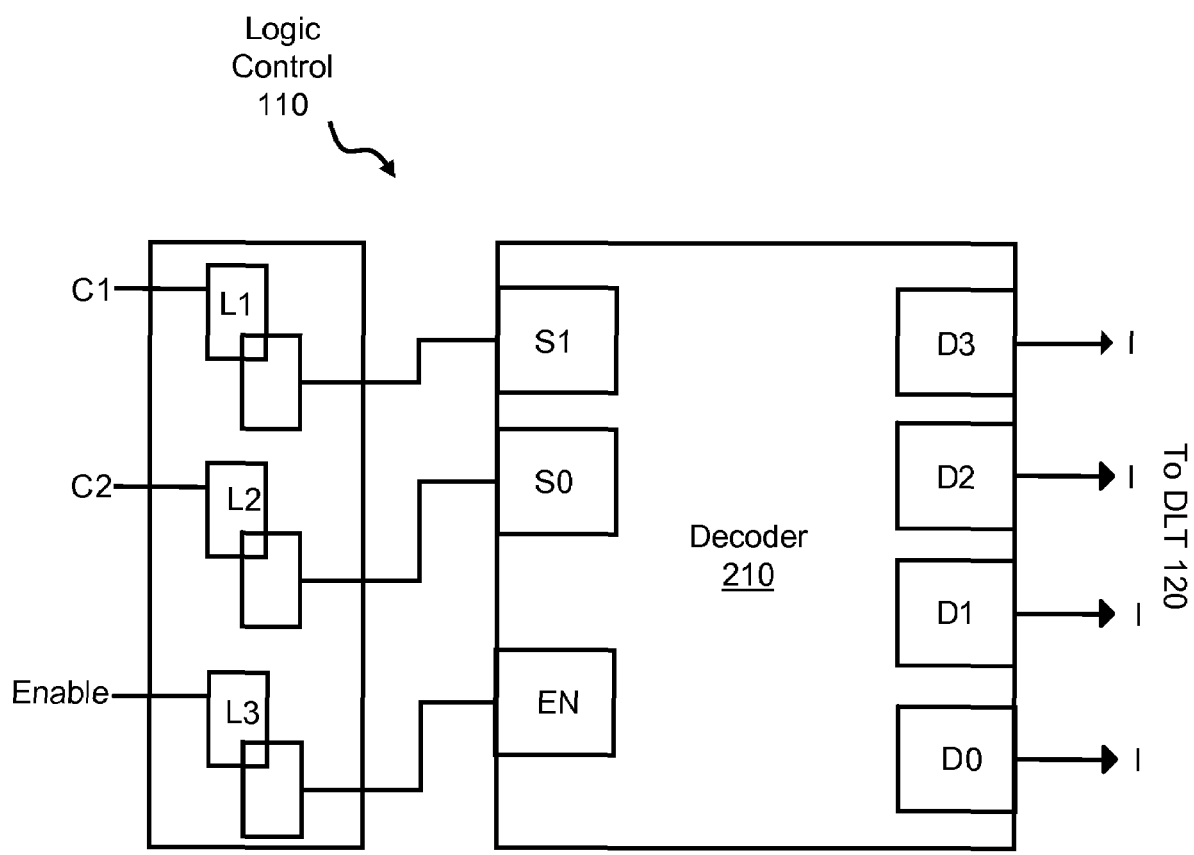
FIG. 2 is a block diagram of the logic control.

FIG. 2 shows logic control 110, which includes a control signal C1 coupled to a latch L1, which is further connected to a pad S1 of a decoder 210. Control signal C2 is coupled to a latch L2, the output of which is coupled to a pad S0 of decoder 210. An enable signal, EN, is coupled to a third latch L3, the output of which is coupled to a pad EN of decoder 210. Decoder 210 further comprises a series of outputs D0-D3, which are each coupled to DLT 120a-d respectively.

Logic control 110 enables each DUT 170 or 180 to be activated individually for test. Decoder 210 is shown in FIG. 2 as a 2:4 decoder for illustrative purposes but need not be limited to a 2:4 decoder. Since DUT 170 and DUT 180 experiments are separated, decoder 210 behaves as a 2 to 8 decoder, controlling DUT 170 and DUT 180 with each decoder output. Typical decode sizes will be 4:16 or 5:32, which will achieve capability of controlling 32 to 64 DUTs. If EN is low, decoder 210 outputs D0-D3 will be low, which ensures all DUT 170 and DUT 180 gates are off.

Figure 3:
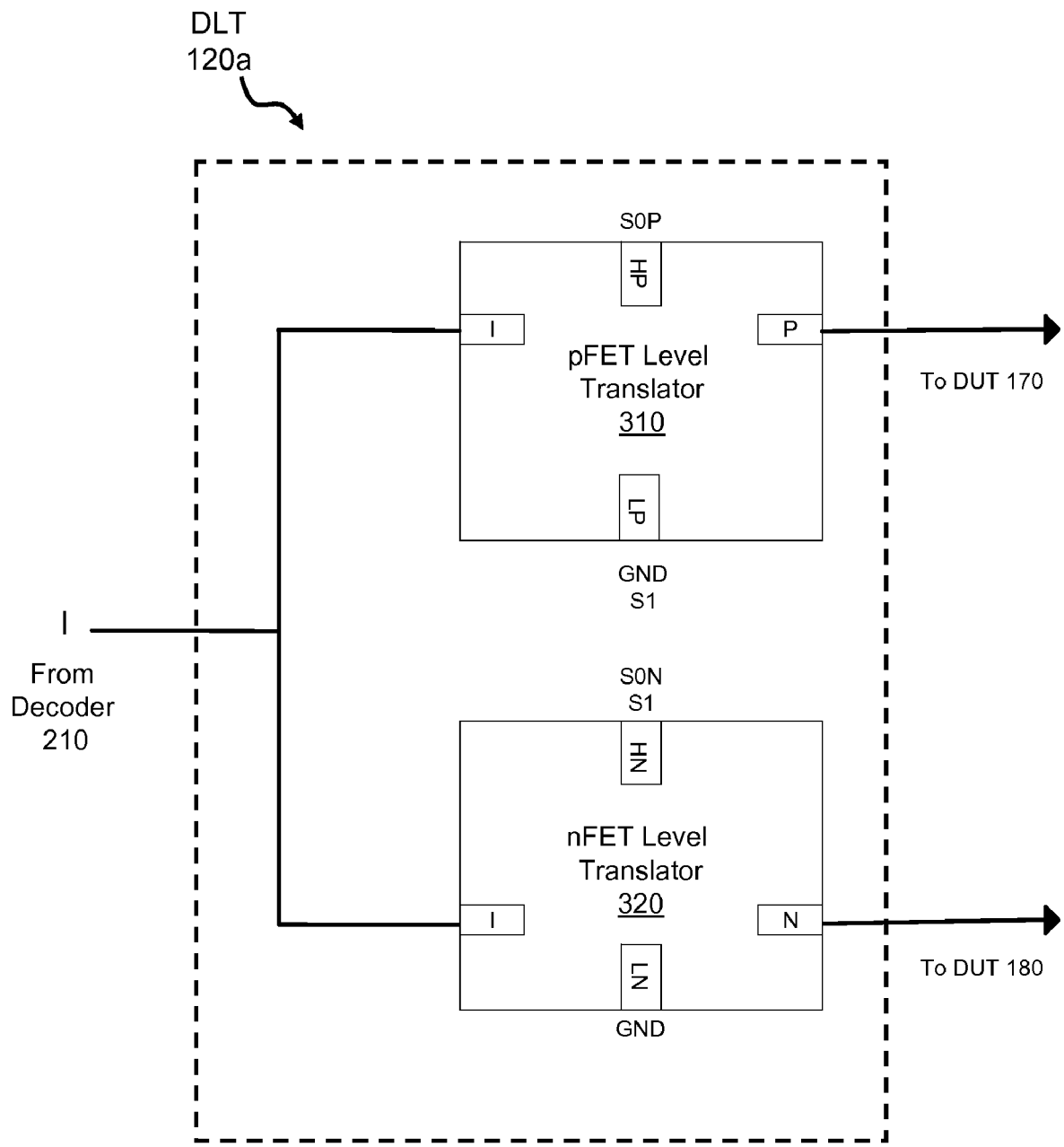
FIG. 3 is a block diagram of the decode level translator (DLT).

FIG. 3 shows a detailed diagram of DLT 120a. DLT 120a is exemplary of any of DLT 120b-d and thus will serve to explain DLT 120 functionality and structure by way of example. DLT 120a includes an input signal, I, from output D3 of decoder 210, a pFET level translator 310, and an nFET level translator 320. pFET level translator 310, further includes an input pad, I, an output pad, P, which is coupled to DUT 170, a second input pad, HP, and a third input pad, LP. nFET level translator 320 includes an input pad, I, which activates/deactivates DLT 120a, an output pad, N, which is coupled to DUT 180, a second input pad, HN, and a third input pad, LN. pFET level translator 310 and nFET level translator 320 are shown in detail in FIGS. 4 and 5 respectively.

In operation, input I to DLT 120a comes from decoder 210. When the output signal D3 from decoder 210, which is connected to the I pin of DLT 120a, is high, the P and N outputs of DLT 120a are active (i.e. N=1, and P=0), which turns on the associated DUT 170 gates, as well as the associated DUT 180 gates. The supply voltage inputs to DLT 120a are shown in Table 1 below.

TABLE 1 values of HP, LP, HN and LN for single and dual supply modes

| | Single | Dual |
|---|---|---|
| HP | S0P | S0P |
| LP | GND | S1 |
| HN | S0N | S1 |
| LN | GND | GND |

In Table 1, "single" supply represents DUT 170 and DUT 180 input from a single voltage source (S0P, S0N) which will drive simple logic 1's and 0's to DUT 170 and DUT 180 respectively.

In Table 1, "dual" represents input from two distinct voltage supplies where HN on nFET level translator 320 receives the signal S1 and LP on pFET level translator 310 also receives the signal S1.

In dual supply mode, S1 is sent to the gates of DUT 170 and 180 from outputs P and N respectively. S1 can be swept to determine the switching voltage ($V_{th}$) and FET current ($I_{ON}$) of DUT 170 and DUT 180.

In general, DLT 120 enables logic control 110 to control DUTs 170 and 180 residing in different voltage realms. DLT 120 provides a means for communication between two voltage domains including Vdd, supplied to control logic 110, and test structure "Supply/VDD/GND" used to generate S0 for DLT 120. The purpose of DLT 120 is to provide accurate logic levels and/or analog gate voltages to DUT 170 and DUT 180 in order to perform device level testing. In the case of BEOL characterization, either nFET level translator 320 or pFET level translator 310 will be used, depending on the FET type used to control DUT 120. Equalizing DUT experiments (equal n and p experiments) optimize use of test circuit 100.

Figure 4:
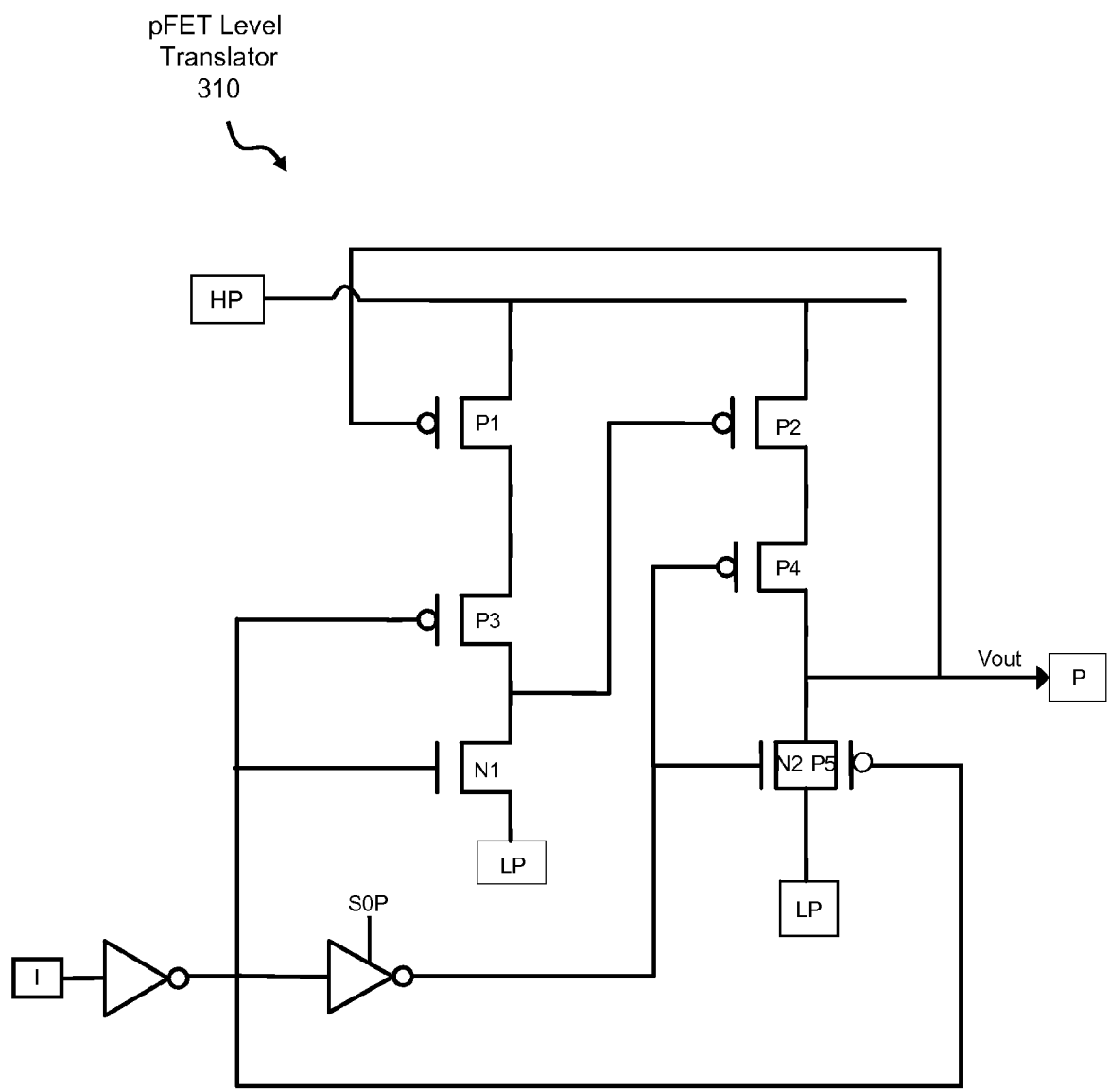
FIG. 4 is a schematic diagram of a pFET DLT (pDLT).

FIG. 4 shows a detailed schematic diagram of pFET level translator 310 which includes pFETs P1-P5, nFETs N1-N2, and a first inverter whose input is I. This inverter is serially connected to a second S0P powered inverter. HP and LP are driven according to the type of test, as shown in Table 1. The output P is sent to DUT 170.

The input to pFET level translator 310 is inverted by the first inverter to achieve an opposite output state when enabled, which is required by pFETs associated with DUT 170. In a single supply application, e.g. applying S0P to HP, the output of pFET level translator 310 has the opposite logic level with respect to the input.

In a dual supply application, S1 is applied to LP. GND is replaced by S1 to allow voltage sweeping through a pass-gate, shown in FIG. 4 as FETs N2 and P5, to DUT 170 gates.

Figure 5:
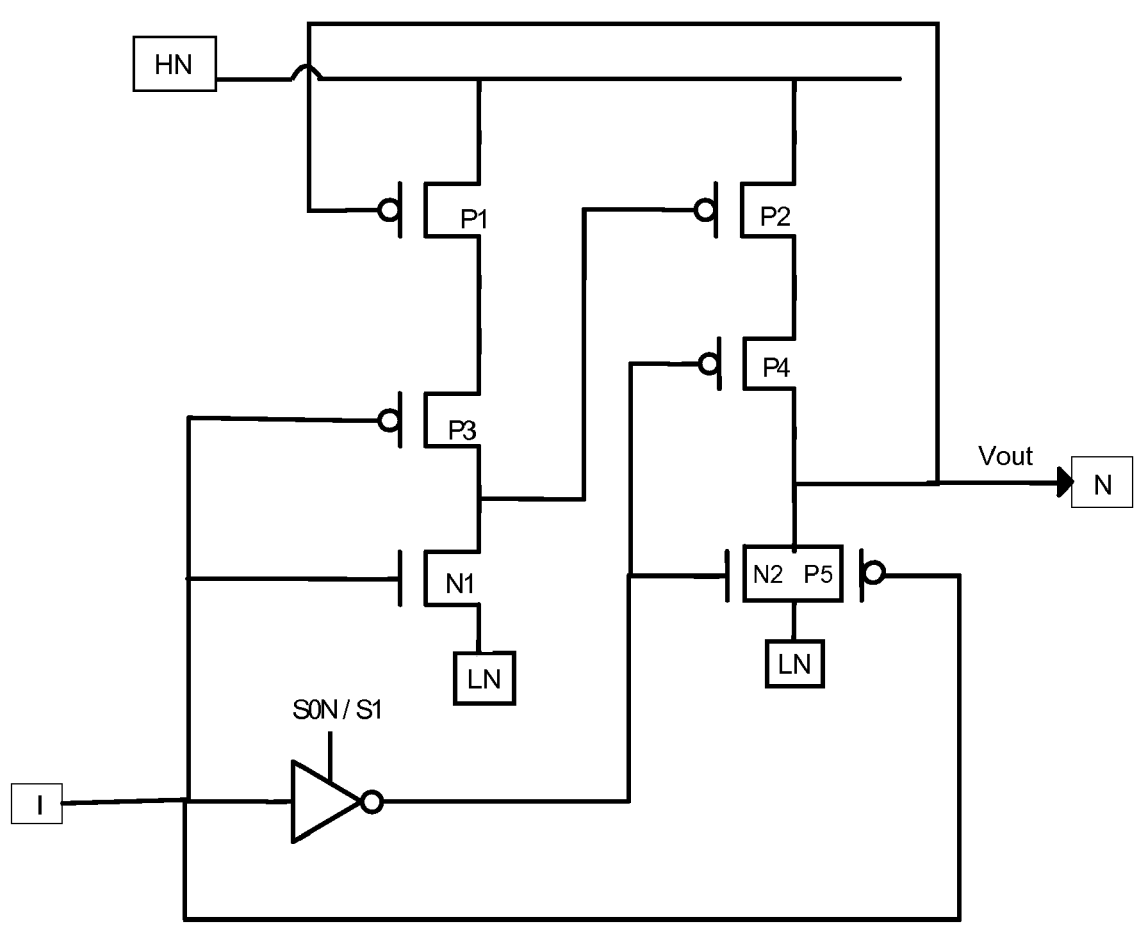
FIG. 5 is a schematic diagram of an nFET DLT (nDLT).

FIG. 5 shows a detailed schematic diagram of nFET level translator 320 which includes pFETs P1-P5, nFETs N1-N2, an inverter whose input is I, and is powered by either S0N or S1. HN and LN are driven according to the type of test, as shown in Table 1. The output N is sent to DUT 180.

nFET level translator 320 has an input which is non-inverting. The power supply for nFET level translator 320 may originate from a derivative of the entire test structure power supply (S0N), or from a separate power supply (S1). S1 controls analog gate voltages for DUT 180.

Figure 6:
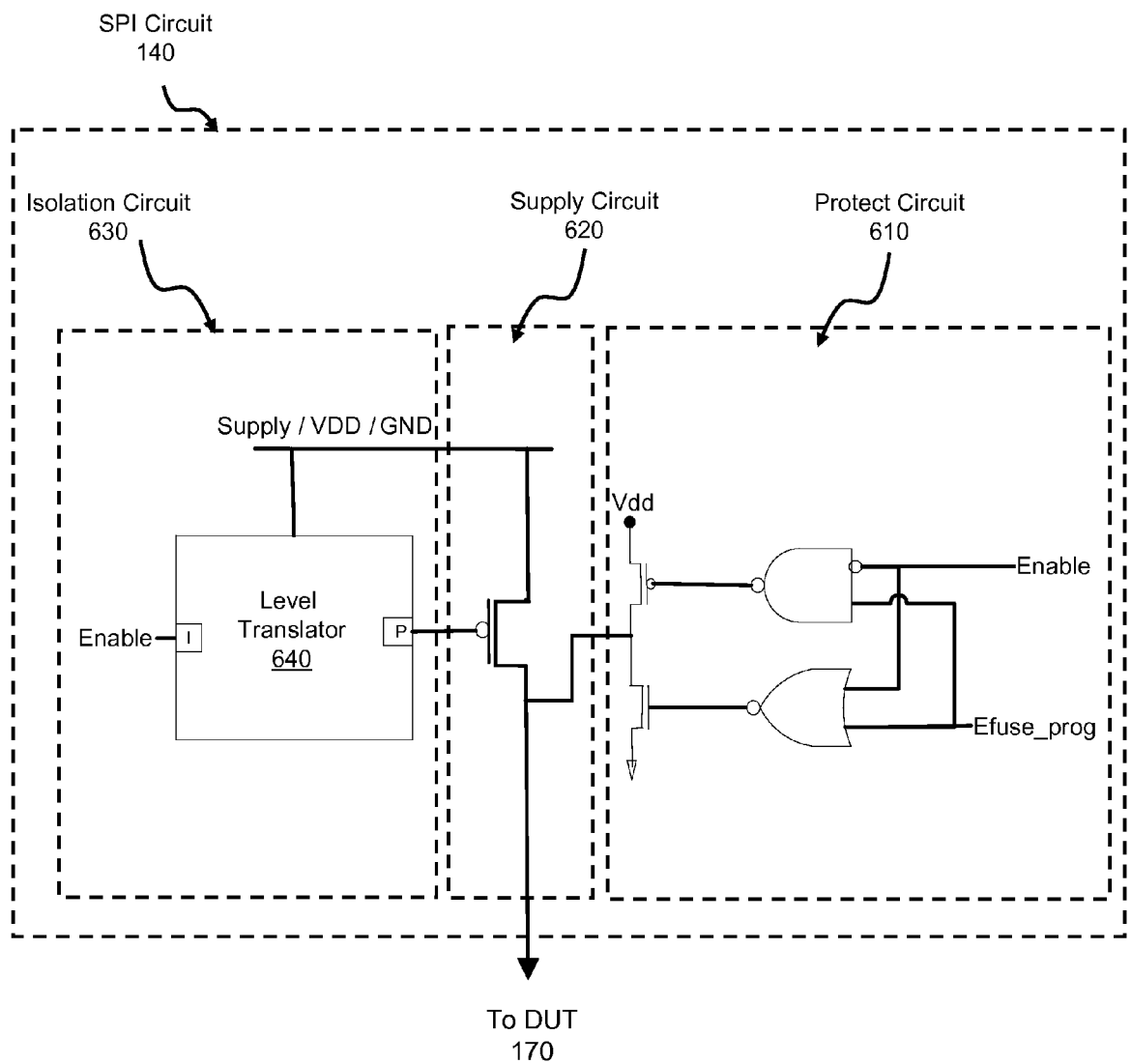
FIG. 6 is a schematic of a supply/protect/isolate (SPI) circuit.

FIG. 6 is a schematic block diagram of SPI circuit 140 which includes a protect circuit 610, a supply circuit 620, and an isolation circuit 630. Isolation circuit 630 further includes level translator 640 having a supply/VDD/GND power supply, an enable input I, and an output P, which is coupled to a pFET of supply circuit 620. A detailed schematic diagram of isolation circuit 630 is shown in FIG. 7 and described below.

Figure 7:
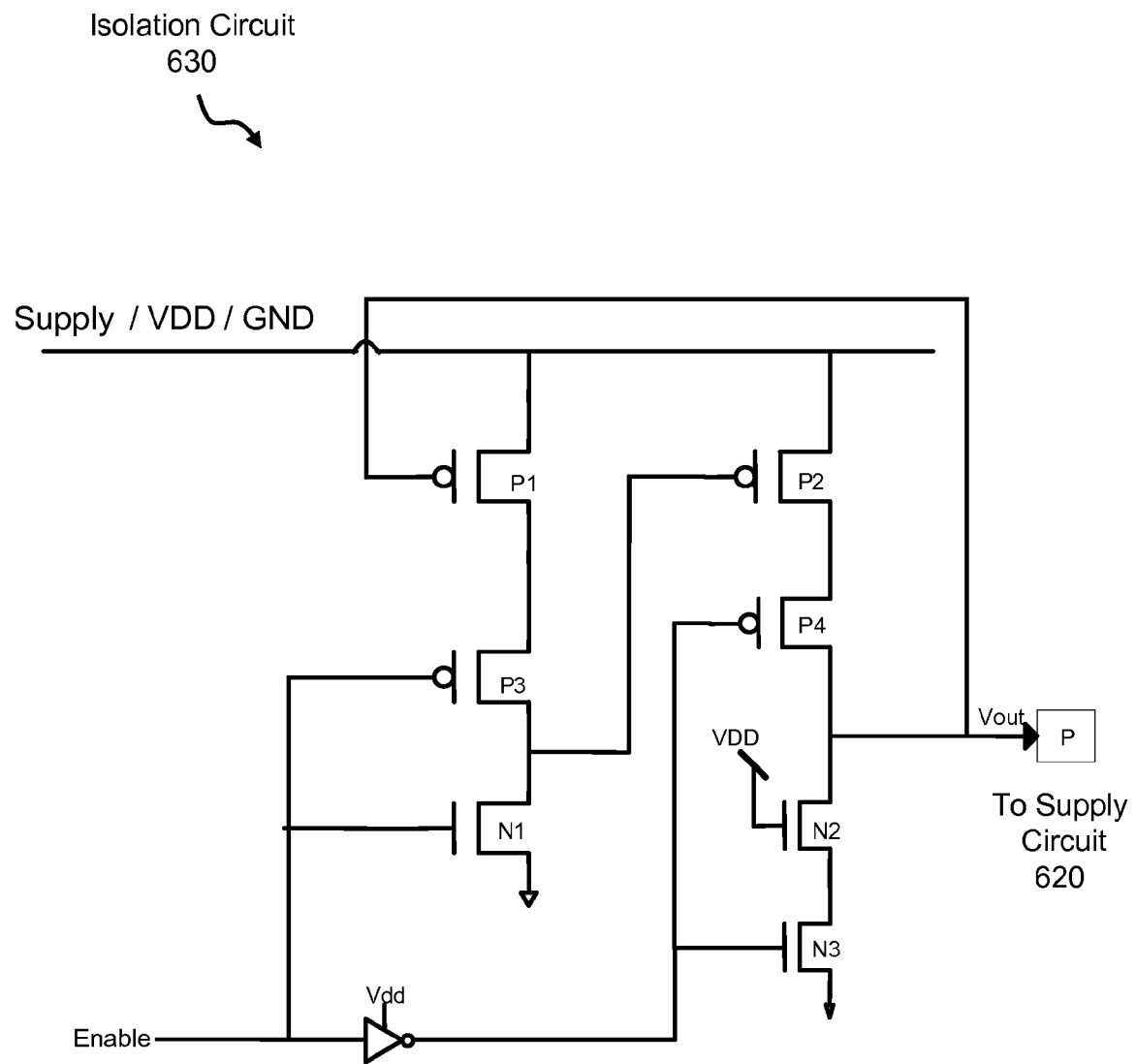
FIG. 7 is a detailed schematic diagram of the isolation circuit.

Level translator 640 of FIG. 7 includes pFETs P1-P4, nFETs N1-N3, and a Vdd powered inverter which has input I. Isolation circuit 630 electrically isolates DUT 170 so that the actual ASIC circuitry is not affected during test, nor is it affected by any leakage current from DUT 170 while the test circuit 100 is not in operation. Level translator 640 routes the supply voltage (Supply/VDD/GND) directly to the corresponding gate of the supply pFET in supply circuit 620 of FIG. 6.

Since test circuit 100 separates nFET and pFET DUTs, it supplies each with a dedicated SPI structure. Only one of SPI circuits 140 or 150 is activated at a time. This is accomplished by selecting the appropriate SPI circuit 140 or 150 to activate using either SPI control circuit 130 or SPI control circuit 160 respectively. Although FIG. 6 shows SPI circuit 140, it is meant to be exemplary of any SPI circuit, including SPI circuit 150 and therefore SPI circuit 150 will not be discussed in further detail.

Figure 8A:
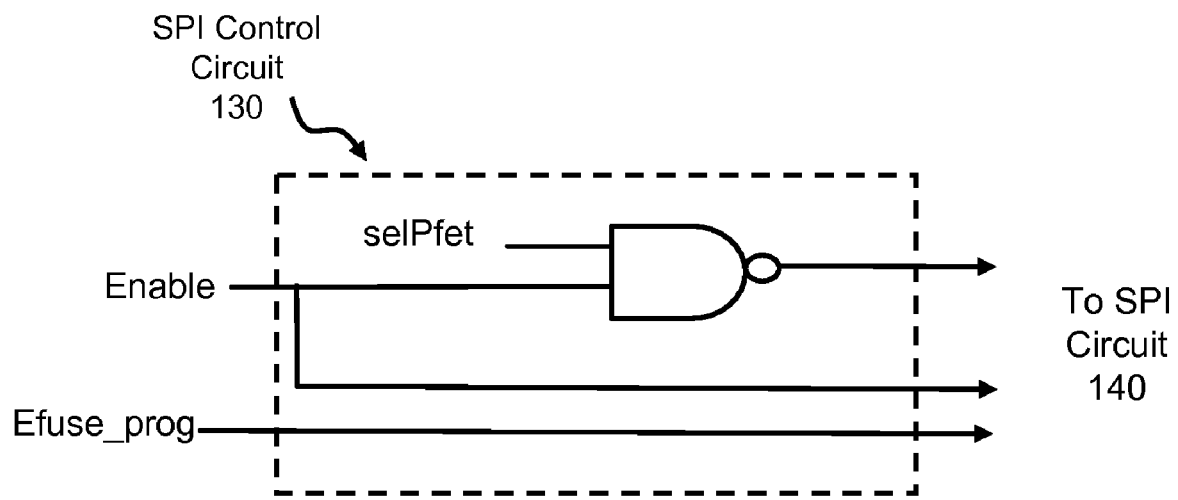
FIG. 8a is a logic diagram of an SPI control circuit for selecting pFET structures during test.
Figure 8B:
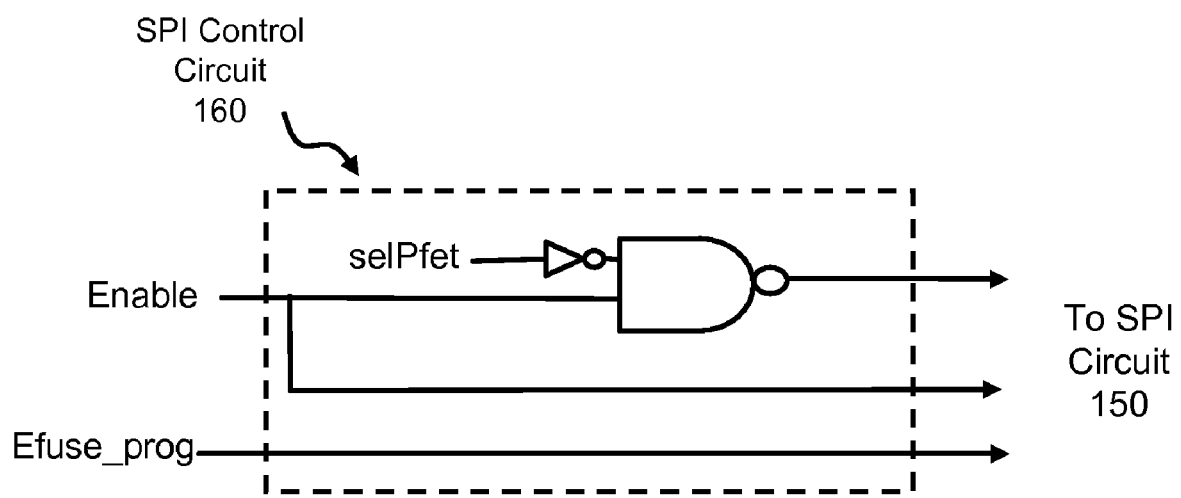
FIG. 8b is a logic diagram of an SPI control circuit for selecting nFET structures during test.

FIG. 8a shows a logic diagram of SPI control circuit 130 and FIG. 8b shows a logic diagram of SPI control circuit 160.

SPI control circuit 130 further includes an Enable signal, an Efuse_prog signal, a selPfet signal, and a NAND gate having inputs from Enable and selPfet, which comes from a latch on the chip (not shown). The Enable, and Efuse_prog signal are further coupled to protect circuit 610. The NAND output directly feeds the I input of SPI circuit 140. By choosing only one SPI circuit at a time (using selPfet, and Enable), current through unused SPI circuit 150 is gated to reduce incidental leakage. Efuse_prog exists to protect non-test circuit 100 IC circuits (not shown). Since test circuit 100 shares the Supply/VDD/GND pin with ASIC circuits, the existing Efuse_prog signal is used to isolate the test structure from other IC operations and vise versa.

The supply voltage is sourced through supply circuit 620. Supply circuit 620 includes a large supply pFET which sends an output signal to DUT 170. The gate of the supply pFET is coupled to the output of isolation circuit 630, the source is connected to Supply/VDD/GND, and the drain is connected to the output of protect circuit 610. The supply pFET is sufficiently large to ensure it will have a minimum voltage drop during test measurements (<50 mV), but robust enough to handle high voltages, which may be at or above 3.0V.

SPI protect circuit 610 protects the supply pFET of supply circuit 620 from excessive source to drain, and gate to drain potential differences when high voltages are applied to Supply/VDD/GND (fatwire I/O). During high voltage applications, Supply=3.0 v and test circuit 100 is inactive (off), i.e. all DUTs 170 and 180 are turned off. When Enable=0 and Efuse_prog=1, VDD is forced through protect circuit 610 and onto the drain of the supply pFET of supply circuit 620. The largest potential difference across the supply pFET is guaranteed to never be larger than Supply minus VDD. Simulation was completed to verify this voltage level is not damaging to the supply pFET.

In the single supply mode of operation either during wafer or module final test (WFT, MFT), a tester (not shown) calculates the current by measuring the background current ($I_{BG}$) and DUT current ($I_{MEAS}$) for each of DUT 170 and DUT 180. $I_{ON}$ is equal to the difference between $I_{MEAS}$ and $I_{BG}$ (i.e. $I_{ON}=I_{MEAS}-I_{BG}$). The tester records the $I_{ON}$ data for both DUT 170 and DUT 180. Table 2 shows a truth table for the Single Mode of operation used for controlling DUT structures 170 and 180.

TABLE 2

Example truth table for single supply mode

| Input | | | | | Single Mode | | | | | | | |
|---|---|---|---|---|---|---|---|---|---|---|---|---|
| selPfet | C1 | C2 | S0P | S0N | P0 | P1 | P2 | P3 | N0 | N1 | N2 | N3 |
| 0 | 0 | 0 | S0P | 0 | GND | S0 | S0 | S0P | S0N | GND | GND | GND |
| 0 | 0 | 1 | S0P | 0 | S0 | GND | S0 | S0P | GND | S0N | GND | GND |
| 0 | 1 | 0 | S0P | 0 | S0 | S0 | GND | S0P | GND | GND | S0N | GND |
| 0 | 1 | 1 | S0P | 0 | S0 | S0 | S0 | GND | GND | GND | GND | S0N |
| 1 | 0 | 0 | 0 | S0N | GND | S0 | S0 | S0P | S0N | GND | GND | GND |
| 1 | 0 | 1 | 0 | S0N | S0 | GND | S0 | S0P | GND | S0N | GND | GND |
| 1 | 1 | 0 | 0 | S0N | S0 | S0 | GND | S0P | GND | GND | S0N | GND |
| 1 | 1 | 1 | 0 | S0N | S0 | S0 | S0 | GND | GND | GND | GND | S0N |

Test circuit 100 is also configurable to separately control the DUT 170 and 180 gate voltages. Dual supply mode testing enables threshold voltage, $V_t$, measurement capability, in addition to $I_{ON}$ measurement capability. In dual supply mode, effective current ($I_{eff}$) can be calculated. $I_{eff}$ is a better indicator of device performance than $I_{ON}$ alone. To implement dual supply mode a dedicated pad, S1, must be wired out. S1 is shown in FIG. 3 as LN and HP respectively.

Table 3 shows an example truth table for dual supply mode.

TABLE 3

Example truth table for dual supply mode

| Input | | | | | Dual Mode | | | | | | | |
|---|---|---|---|---|---|---|---|---|---|---|---|---|
| selPfet | C1 | C2 | S0P | S0N | P0 | P1 | P2 | P3 | N0 | N1 | N2 | N3 |
| 0 | 0 | 0 | S0P | 0 | S1 | S0P | S0P | S0P | S1 | GND | GND | GND |
| 0 | 0 | 1 | S0P | 0 | S0P | S1 | S0P | S0P | GND | S1 | GND | GND |
| 0 | 1 | 0 | S0P | 0 | S0P | S0P | S1 | S0P | GND | GND | S1 | GND |
| 0 | 1 | 1 | S0P | 0 | S0P | S0P | S0P | S1 | GND | GND | GND | S1 |
| 1 | 0 | 0 | 0 | S0N | S1 | S0P | S0P | S0P | S1 | GND | GND | GND |
| 1 | 0 | 1 | 0 | S0N | S0P | S1 | S0P | S0P | GND | S1 | GND | GND |
| 1 | 1 | 0 | 0 | S0N | S0P | S0P | S1 | S0P | GND | GND | S1 | GND |
| 1 | 1 | 1 | 0 | S0N | S0P | S0P | S0P | S1 | GND | GND | GND | S1 |

Figure 9:
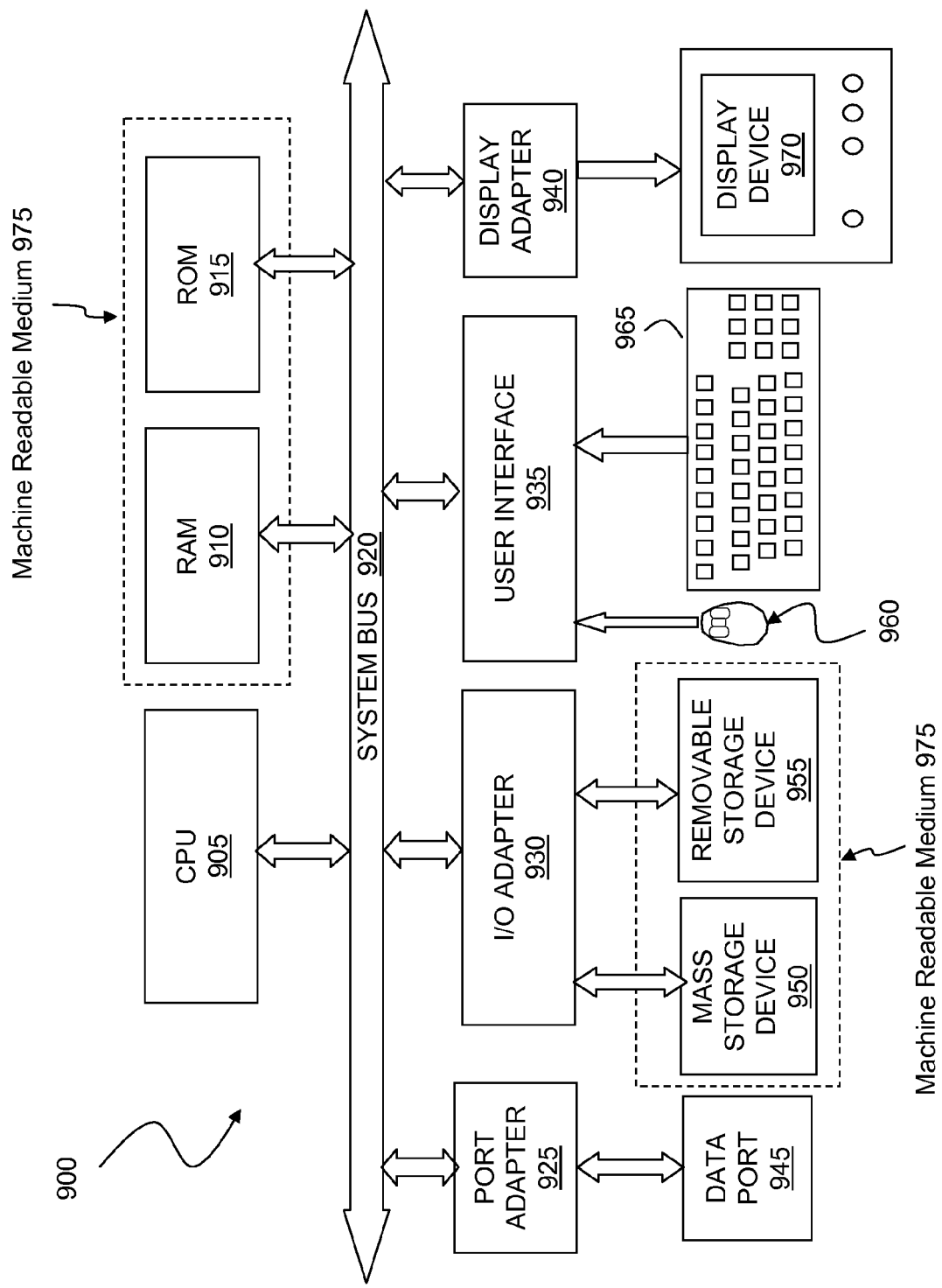
FIG. 9 is an example of a general-purpose computer system and computer readable medium.

FIG. 9 illustrates a block diagram of a general-purpose computer system which can be used to implement the system and method described herein. The system and method may be coded as a set of instructions on removable or hard media for use by general-purpose computer. FIG. 9 is a schematic block diagram of a general-purpose computer for practicing the present invention. FIG. 9 shows a computer system 900, which has at least one microprocessor or central processing unit (CPU) 905. CPU 905 is interconnected via a system bus 920 to machine readable media 975, which includes, for example, a random access memory (RAM) 910, a read-only memory (ROM) 915, a removable and/or program storage device 955 and a mass data and/or program storage device 950. An input/output (I/O) adapter 930 connects mass storage device 950 and removable storage device 955 to system bus 920. A user interface 935 connects a keyboard 965 and a mouse 960 to system bus 920, and a port adapter 925 connects a data port 945 to system bus 920 and a display adapter 940 connect a display device 970. ROM 915 contains the basic operating system for computer system 900. Examples of removable data and/or program storage device 955 include magnetic media such as floppy drives, tape drives, portable flash drives, zip drives, and optical media such as CD ROM or DVD drives. Examples of mass data and/or program storage device 950 include hard disk drives and non-volatile memory such as flash memory. In addition to keyboard 965 and mouse 960, other user input devices such as trackballs, writing tablets, pressure pads, microphones, light pens and position-sensing screen displays may be connected to user interface 935. Examples of display device 970 include cathode-ray tubes (CRT) and liquid crystal displays (LCD).

A machine readable computer program may be created by one of skill in the art and stored in computer system 900 or a data and/or any one or more of machine readable medium 975 to simplify the practicing of this invention. In operation, information for the computer program created to run the present invention is loaded on the appropriate removable data and/or program storage device 955, fed through data port 945 or entered using keyboard 965. A user controls the program by manipulating functions performed by the computer program and providing other data inputs via any of the above mentioned data input means. Display device 970 provides a means for the user to accurately control the computer program and perform the desired tasks described herein.

Figure 10:
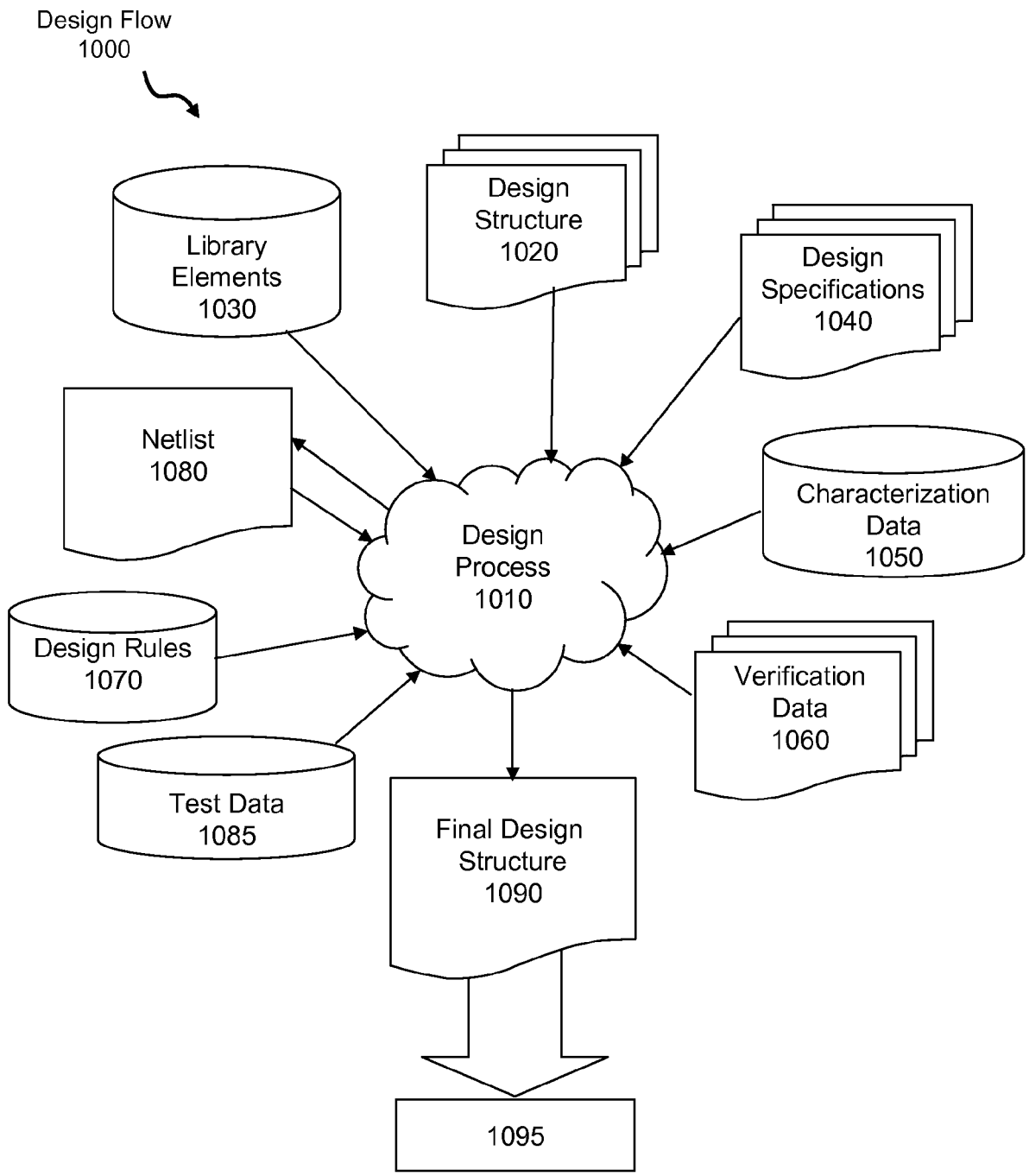
FIG. 10 is an example design flow process of instantiating a design structure comprising a test circuit into an IC design to create a final design structure.

FIG. 10 shows a block diagram of an example design flow 1000. Design flow 1000 may vary depending on the type of IC being designed. For example, a design flow 1000 for building an application specific IC (ASIC) will differ from a design flow 1000 for designing a standard component. Design structure 1020 is an input to a design process 1010 and may come from an IP provider, a core developer, or other design company. Design structure 1020 comprises test circuit 100 in the form of schematics or HDL, a hardware-description language, (e.g., Verilog, VHDL, C, etc.). Design structure 1020 may be on one or more of machine readable medium 975 as shown in FIG. 9. For example, design structure 1020 may be a text file or a graphical representation of test circuit 100. Design process 1010 synthesizes (or translates) test circuit 100 into a netlist 1080, where netlist 1080 is, for example, a list of fat wires, control blocks 190, and DUTs 170 and/or 180 and describes the connections to other elements and circuits in an integrated circuit design and recorded on at least one of machine readable medium 975.

Design process 1010 includes using a variety of inputs; for example, inputs from library elements 1030 which may house a set of commonly used elements, circuits, and devices, including models, layouts, and symbolic representations, for a given manufacturing technology (e.g. different technology nodes, 32 nm, 45 nm, 90 nm, etc.), design specifications 1040, characterization data 1050, verification data 1060, design rules 1070, and test data files 1085, which may include test patterns and other testing information. Design process 1010 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1010 without deviating from the scope and spirit of the invention.

Ultimately design process 1010 translates test circuit 100, along with the rest of the integrated circuit design (if applicable), into a final design structure 1090 (e.g., information stored in a GDS storage medium). Final design structure 1090 may comprise information such as, for example, test data files, design content files, manufacturing data, layout parameters, wires, levels of metal, vias, shapes, test data, data for routing through the manufacturing line, and any other data required by a semiconductor manufacturer to produce test circuit 100. Final design structure 1090 may then proceed to a stage 1095 of design flow 1000; where stage 1095 is, for example, where final design structure 1090: proceeds to tape-out, is released to manufacturing, is sent to another design house or is sent back to the customer.

Figure 11:
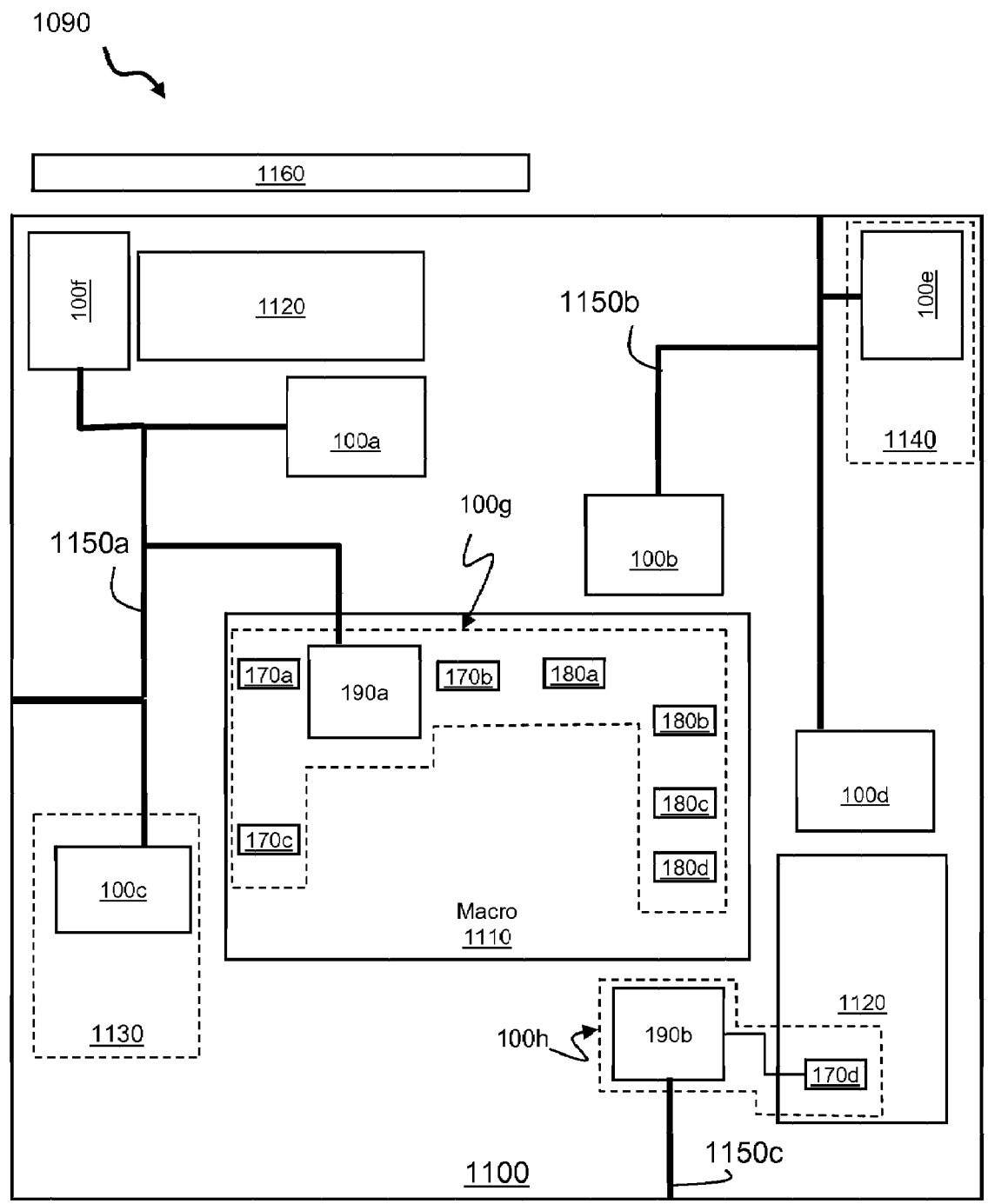
FIG. 11 shows an example of representative data that could be stored in the final design structure.

FIG. 11 shows an example of some of the layout data, which could be stored in final design structure 1090. In this example, final design structure 1090 comprises test structures 100 in various layout locations and connected to various devices and macros within integrated circuit 1100. Test circuit 100a is located near macro 1120 and connected to fat wire I/O 1150a. Macro 1120 is any logic circuit or structure, for example, macro 1120 may be a performance screening ring oscillator (PSRO). Test circuit 100f is also located near macro 1120 and near kerf 1160. Test circuit 100g is located within macro 1110 and DUTs 170a-c and 180a-d are integrated into various locations for optimal testing. Control block 190a is connected to each of DUTs 170 and 180 (connections not shown) as well as fat wire I/O 1150a. Test circuit 100h comprises control block 190b and DUT 170d where DUT 170d is located within macro 1120 and control block 190b is located outside the boundaries of macro 1120. Control block 190b is further connected to fat wire 1150c. Test circuit 100c is located in backfill area 1130 and test circuit 100e is located within ECID macro 1140. Test structures 100a, b, d, and f are instantiated in design structure 1090 as stand-alone macros.

Thus, final design structure 1090 comprises the instructions for manufacturing example integrated circuit 1100 such that the physical IC will resemble, at a high level, the simplistic block diagram example layout of integrated circuit 1100 as it is instantiated in final design structure 1090.

The above description and drawings are only to be considered illustrative of exemplary embodiments, which achieve the features and advantages of the invention. It should be appreciated by one of ordinary skill in the art that modification and substitutions to specific layout designs, systems for performing the tests and analysis, and the devices themselves can be made without departing from the spirit and scope of the invention. Accordingly, the invention is not to be considered as being limited by the foregoing description and drawings.

What is claimed is:

1. A design structure instantiated in a machine readable medium for design and manufacturing a test circuit,
the test circuit comprising:
a plurality of device under test (DUT) structures;
a control block for controlling testing of the DUT structures;
a logic controller having a decoder which activates at least one DUT structure;
a decode level translator which provides a required gate voltage to one or more of the DUT structures;
at least one protect circuit coupled to at least one supply circuit, the supply circuit further coupled to at least one isolation circuit and to at least one of the DUT structures; and
a control circuit for controlling the protect circuit, the isolation circuit, and the supply circuit;
the protect circuit comprises a first logic gate coupled to an nFET and a second logic gate coupled to a pFET, the protect circuit protects the supply circuit from excessive source to drain, and gate to drain potential differences when high voltages are applied;
the isolation circuit comprises a level translator comprising a plurality of pFETs, a plurality of nFETs, and a Vdd powered inverter;
the isolation circuit electrically isolates the DUT structures so that no functional circuitry is affected during a test, nor is the functional circuitry affected by a leakage current while the test circuit is not in operation.

2. The DUT structures of claim 1, wherein a portion of the DUT structures are nFET DUT structures and a portion of the DUT structures are pFET DUT structures.

3. The DUT structures of claim 1, wherein the DUT structures comprise at least one electronic circuit component from the group consisting of resistors, capacitors, wires, and inductors.

4. The control block of claim 1, wherein the decode level translator comprises a pFET level translator and an nFET level translator; the decode level translator receives control input from a decoder.

5. The decoder of claim 4, wherein the decoder is at least a 2:4 decoder.

6. The test circuit of claim 4, wherein a test is performed using a single voltage supply input to the pFET level translator and the nFET level translator.

7. The test circuit of claim 4, wherein a test is performed using a dual voltage supply input to the pFET level translator and the nFET level translator.

8. The pFET level translator of claim 4, comprising a plurality of pFET devices, a plurality of nFET devices, and at least one inverter and is configured such that the gate voltage of the corresponding pFET DUT structure is activated when the pFET level translator is enabled.

9. The nFET level translator of claim 4, comprising a plurality of pFET devices, a plurality of nFET devices, and at least one inverter and is configured such that the gate voltage of the corresponding nFET DUT structure is activated when the nFET level translator is enabled.

10. The test circuit of claim 1, wherein the supply circuit comprises a pFET.

11. The test circuit of claim 1, wherein the protect circuit comprises at least one control signal to disable the test circuit.

12. A design structure instantiated in a machine readable medium for designing and manufacturing a test circuit,
the design structure comprising machine readable instructions for manufacturing at least one test circuit;
the test circuit comprising:
a plurality of device under test (DUT) structures;
a control block for controlling testing of the DUT structures;
a logic controller having a decoder which activates at least one DUT structure;
a decode level translator which provides a required gate voltage to one or more of the DUT structures;
at least one protect circuit coupled to at least one supply circuit, the supply circuit further coupled to at least one isolation circuit and to at least one of the DUT structures; and
a control circuit for controlling the protect circuit, the isolation circuit, and the supply circuit;
the protect circuit comprises a first logic gate coupled to an nFET and a second logic gate coupled to a pFET, the protect circuit protects the supply circuit from excessive source to drain, and gate to drain potential differences when high voltages are applied;
the isolation circuit comprises a level translator comprising a plurality of pFETs, a plurality of nFETs, and a Vdd powered inverter;
the isolation circuit electrically isolates the DUT structures so that no functional circuitry is affected during a test, nor is the functional circuitry affected by a leakage current while the test circuit is not in operation.

13. The design structure of claim 12, wherein the test circuit is instantiated in the design structure as a stand-alone macro.

14. The design structure of claim 12, wherein the DUT structures are instantiated in a backfill area of the integrated circuit.

15. The design structure of claim 12 wherein the test circuit is integrated into an electronic chip identifier (ECID) macro.

16. The design structure of claim 12, wherein an integrated circuit comprises a plurality of macros, a portion of the macros further comprising at least a portion of the DUT structures.

17. The design structure of claim 16, wherein the control block is adapted to test at least one of the portion of DUT structures.

18. The design structure of claim 12, wherein the design structure comprises a netlist, which describes the test circuit.

19. The design structure of claim 12, wherein the design structure resides on a GDS storage medium.

* * * * *